US006846752B2

(12) United States Patent
Chambers et al.

(10) Patent No.: US 6,846,752 B2
(45) Date of Patent: Jan. 25, 2005

(54) METHODS AND DEVICES FOR THE SUPPRESSION OF COPPER HILLOCK FORMATION

(75) Inventors: Stephen Chambers, Portland, OR (US); Dan S. Lavric, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/465,389

(22) Filed: Jun. 18, 2003

(65) Prior Publication Data

US 2004/0259378 A1 Dec. 23, 2004

(51) Int. Cl.[7] ............................................. H01L 21/31
(52) U.S. Cl. ...................... 438/771; 438/240; 438/637
(58) Field of Search ............................... 438/240, 637, 438/771, 239, 253, 393, 396

(56) References Cited

U.S. PATENT DOCUMENTS

| | | | | |
|---|---|---|---|---|
| 6,225,157 | B1 | * | 5/2001 | Thakur et al. ............... 438/240 |
| 6,300,241 | B1 | * | 10/2001 | Moore et al. ................ 438/637 |
| 6,375,746 | B1 | * | 4/2002 | Stevens et al. .............. 118/719 |
| 6,451,664 | B1 | * | 9/2002 | Barth et al. ................. 438/396 |
| 6,528,364 | B1 | * | 3/2003 | Thakur ....................... 438/239 |
| 6,620,740 | B2 | * | 9/2003 | Thakur ....................... 438/771 |

OTHER PUBLICATIONS

Armacost, M., et al., A High Reliability Metal Insulator Metal Capacitor for 0.18μm Copper Technology, International Electron Devices Meeting 2000, Dec. 10–13, 2000, San Francisco, CA, IEDM Technical Digest, pp. 157–160, Sponsored by Electronic Devices Society of IEEE.

Lin, C.C., et al., A Full Cu Damascene Metallization Process for Sub–0.18μm RF CMOS SoC High Q Inductor and MIM Capacitor Application at 2.4GHz and 5.3GHz, pp. 113–115, Interconnect Technology Conference 2001, Proceedings of the IEEE 2001.

Liu, Ruichen, et al., Single Mask Metal–Insulator–Metal (MIM) Capacitor with Copper Damascene Metallization for Sub–0.18μm Mixed Mode Signal and System–on–a–chip (SoC) Applications, Proceedings of the IEEE 2000 International Interconnect Technology Conference, Jun. 5–7, 2000, Hyatt Regency Hotel, San Francisco Airport, Burlingame, CA, pp. 111–113.

* cited by examiner

*Primary Examiner*—David Nelms
*Assistant Examiner*—Dao H. Nguyen
(74) *Attorney, Agent, or Firm*—Blakely, Sokoloff, Taylor & Zafman LLP

(57) ABSTRACT

The present invention provides embodiments of methods and devices for the suppression of copper hillocks. Copper hillocks are suppressed by capping the copper layer with a dielectric film before any significant growth of copper hillocks can begin using a ramped temperature dielectric deposition process. Copper hillocks are also suppressed by doping a copper layer with a dopant that will constrain the grain size of the copper during subsequent processing. These methods are applicable to the construction of MIM capacitors and interconnect structures.

23 Claims, 12 Drawing Sheets

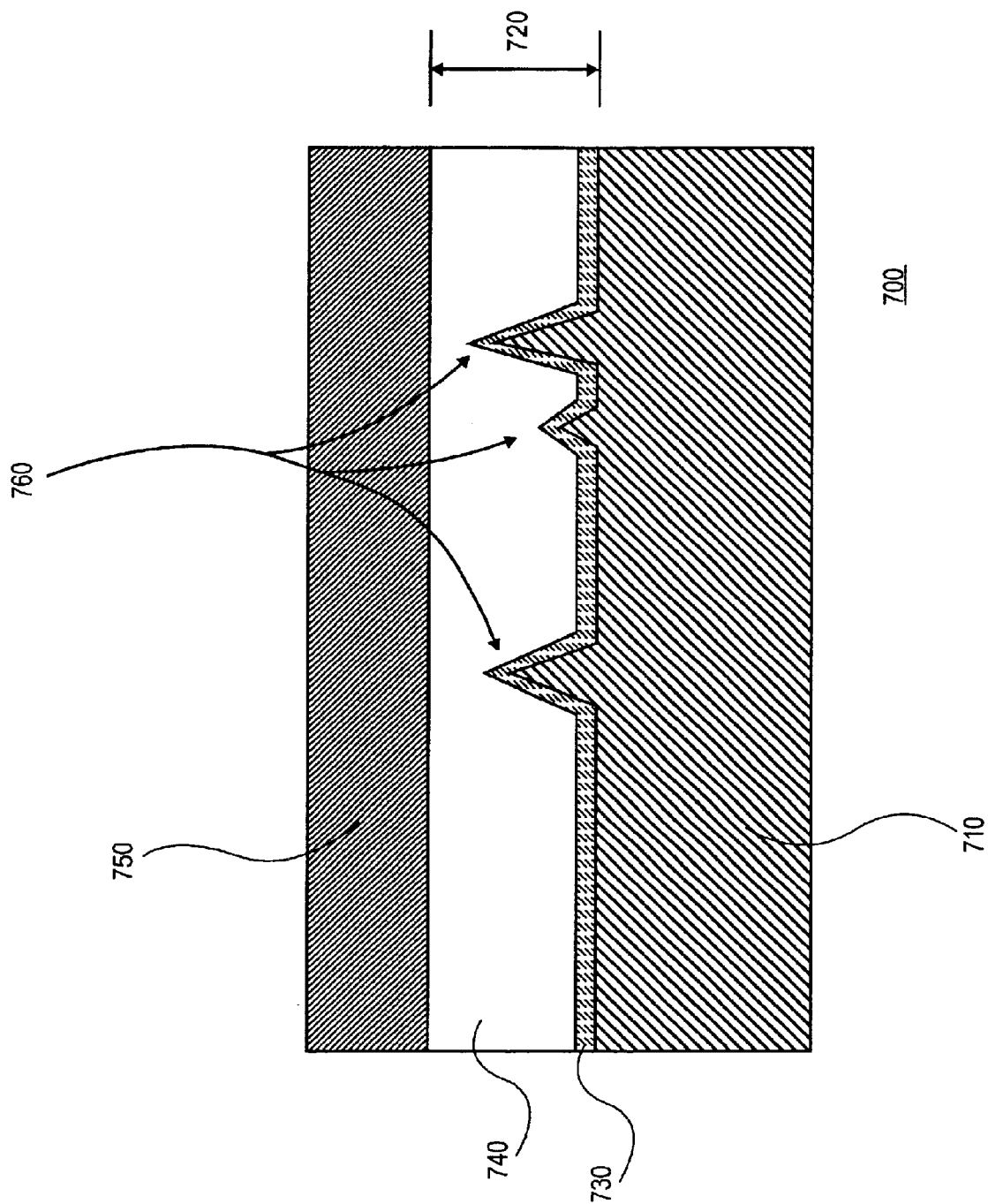

METHODS AND DEVICES FOR THE SUPPRESSION OF COPPER HILLOCK FORMATION

FIELD OF THE INVENTION

Embodiments of the present invention relate to the field of semiconductor processing and the fabrication of integrated circuits. In particular, embodiments of the present invention provide methods and devices for the prevention of copper hillocks that can cause the early breakdown of semiconductor devices.

BACKGROUND

Copper has become the metal of choice over aluminum in the fabrication of integrated circuits because it has a lower resistance than aluminum and allows for the scaling down of devices. Despite its advantages, the use of copper in interconnect structures poses several special problems that did not exist with the use of aluminum. One such problem is the formation of copper hillocks. Copper is a soft metal and has a much higher expansion coefficient than aluminum, so that when it is heated under typical temperatures used in semiconductor processing it will expand significantly. Copper hillocks are a result of this expansion. Copper interconnect lines are typically formed by a dual damascene, or inlaid, metal process where both trenches and vias are etched into a dielectric layer and are then filled with copper metal. A barrier layer to prevent the migration of copper is typically formed in the trenches and vias before the copper is added. The copper within the trenches and vias is constrained on three sides by the barrier layer within the trench, and when heated it can only expand upwards or along the copper line. The copper expands from the copper line in the form of spike-like projections, hence the name "hillocks." Copper hillocks are a serious problem because they can cause shorts and voids in dual damascene structures and MIM (metal-insulator-metal) capacitors, and can ultimately cause the early breakdown of the semiconductor device.

FIG. 1a illustrates a planarized copper dual damascene structure fabricated by a well-known technique. The dual damascene structure 1a has a first copper line 110 that is formed within a barrier layer 115 that is formed within a trench that was etched in a first dielectric layer 120. Copper hillocks such as 125 typically begin to form before any subsequent processing due to pent up thermal expansion energy in the copper. FIG. 1b illustrates the first interconnect structure 130 after a second dielectric 135 (typically SiN), that will serve as an etch stop layer, has been formed over the first copper line 110. The second dielectric 135 typically has a thickness 140 of between 650 Å and 1250 Å. A silicon nitride deposition is typically performed at 400° C., a temperature at which copper will expand significantly and form copper hillocks. The copper hillocks 125 that already existed before the silicon nitride deposition will grow larger, and additional copper hillocks such as 145, will form during the deposition.

FIG 1c illustrates FIG. 1b after a second interconnect structure 150 has been formed over the second dielectric 135 of the first interconnect structure 130. The heat and pressure exerted on the first interconnect structure 130 during the formation of the third dielectric layer 155, and subsequent layers, can cause the copper hillocks to grow even larger. The third dielectric 155 is typically carbon or fluorine doped silicon oxide that is deposited at temperatures of around 450° C. to 480° C. These temperatures will cause significant expansion of the copper and growth of hillocks. The growth of the large copper hillocks can cause a short 160 between the first copper line 110 and the second copper line 165. Also, the formation of hillocks can cause a void 170 to form within the first copper line 110.

FIG. 2 illustrates a simplified MIM capacitor 200 that has been formed by the conventional process of forming MIM capacitors. The bottom electrode 210 is typically formed by the conventional dual damascene process used to form copper interconnect lines. The insulator 220 is typically SiN and is deposited by PECVD at 400° C. The tantalum or TaN top electrode 230 is then deposited by sputtering or CVD. During the process of forming the MIM capacitor, copper hillocks such as 240 will form because of the heat and pressure exerted on the copper bottom electrode 210 during the PECVD deposition of the SiN insulator 220 and during the formation of an interconnect structure on top of the MIM. Some copper hillocks may grow large enough to cause a short 250.

Others have tried to solve the problem of copper hillocks in several ways. One solution is to use a thicker interlayer dielectric (ILD) so that the hillocks have to grow very tall in order to cause a short in a device. A thicker ILD will also help constrain the growth of hillocks because the hillocks will have to expend more energy to push through more material. The thickness of the ILD therefore has the effect of modulating the growth of the hillocks. But, increasing the thickness of the ILD is disadvantageous for the scaling down of devices and for devices such as metal-insulator-metal capacitors, where the thinnest possible dielectric layer is desired as the insulator.

Another solution to prevent the formation of copper hillocks is to reduce the temperatures used in the processing. Copper hillocks typically form at temperatures above 150° C. Therefore the reduction of the thermal budget of the processing can be restricted to temperatures below 150° C. Even the reduction of the thermal budget to around 350° C. can reduce the number of Cu hillocks defects. This is not effective in producing optimal semiconductor devices because such low temperatures produce materials having the undesirable qualities of lower density and less homogeneity.

Yet another solution to prevent the formation of copper hillocks is to anneal the copper before the chemical mechanical polishing (CMP) of the copper. The intent of this anneal is to expend most of the thermal expansion energy of the copper into the formation of copper hillocks that can then be polished away during the CMP step. By expending most or all of the thermal expansion energy of the copper during this pre-CMP anneal, hillocks are less likely to form at a later point. A similar solution is to form two ILD layers over the copper where the purpose of the first ILD is to cause the formation of copper hillocks and exhaust most of the thermal expansion energy of the copper. The copper hillocks would then be polished away along with the first ILD before the formation of the second ILD. These are not the best solutions because they require extra process stages and also risk the formation of voids in the copper interconnect structure due to the hillock growth.

BRIEF DESCRIPTION OF THE DRAWINGS

FIG. 7 is an illustration of a cross-sectional view of a MIM capacitor in which copper hillocks have been capped and suppressed by a dielectric layer deposited by the ramped dielectric deposition technique.

DETAILED DESCRIPTION

Methods for the prevention of copper hillocks and devices constructed using such methods are described. In the following description numerous specific details are set forth to provide an understanding of the embodiments of the present invention. It will be apparent, however, to those skilled in the art and having the benefit of this disclosure, that the embodiments of the present invention may be practiced with materials and processes that vary from those specified here.

Copper hillocks are a significant problem in semiconductor devices made with copper. Copper hillocks can cause shorts and voids in copper dual damascene structures and cause the shorting and the early breakdown of metal-insulator-metal (MIM) capacitors. MIM capacitors are especially sensitive to copper hillocks. Therefore, embodiments of the present invention provide methods of preventing the formation of copper hillocks in dual damascene structures and MIM capacitors. One such method is a ramped dielectric deposition technique where the copper hillocks are capped and suppressed by a dielectric layer before they can grow large enough to cause shorts or other significant problems in a device. This method takes advantage of temperatures during the ramp up stage for a wafer in a deposition chamber to deposit a dielectric layer at a temperature before which copper begins to expand and form hillocks. Another method is to dope the copper layer with a dopant provided by a seed layer that will suppress the formation of copper hillocks. These methods can be used separately or in combination.

An embodiment of the present invention suppresses the growth of copper hillocks with a ramped temperature dielectric deposition technique. This technique will prevent the formation of copper hillocks by capping the copper with a dielectric layer before hillock growth occurs. The prevention of copper hillocks is accomplished by capping the copper at a temperature at which the copper will not significantly expand and form hillocks with a dielectric layer that has enough integrity and is thick enough to prevent any subsequent hillock growth. In an embodiment of the present invention the copper is capped by initiating the dielectric deposition while the wafer is ramping towards the final target deposition temperature for the dielectric, taking advantage of the lower temperatures of a processing stage that already occurs in a dielectric deposition process. This method is useful for the deposition of dielectrics with target deposition temperatures of above 350° C. at which significant hillock formation occurs. The dielectric film that is deposited at temperatures below the target temperature during ramping will cap the copper before significant copper expansion and hillock growth will occur at the target temperature. This method would work with any dielectric material, and in particular those that can serve as both an etch stop and a barrier to copper diffusion.

Figure 1A:
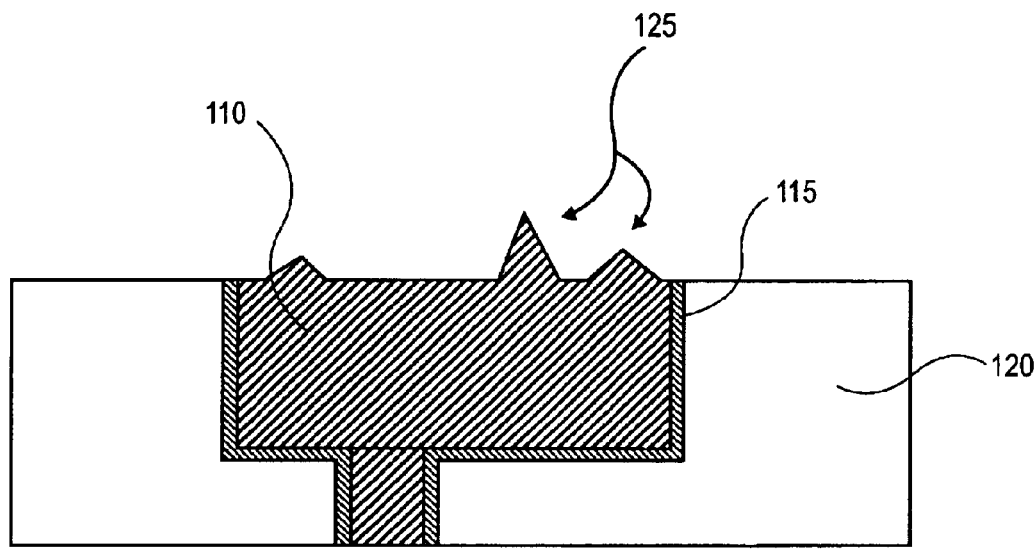
FIG. 1a is an illustration of a cross-sectional view of a dual damascene structure with copper hillocks.
Figure 1B:
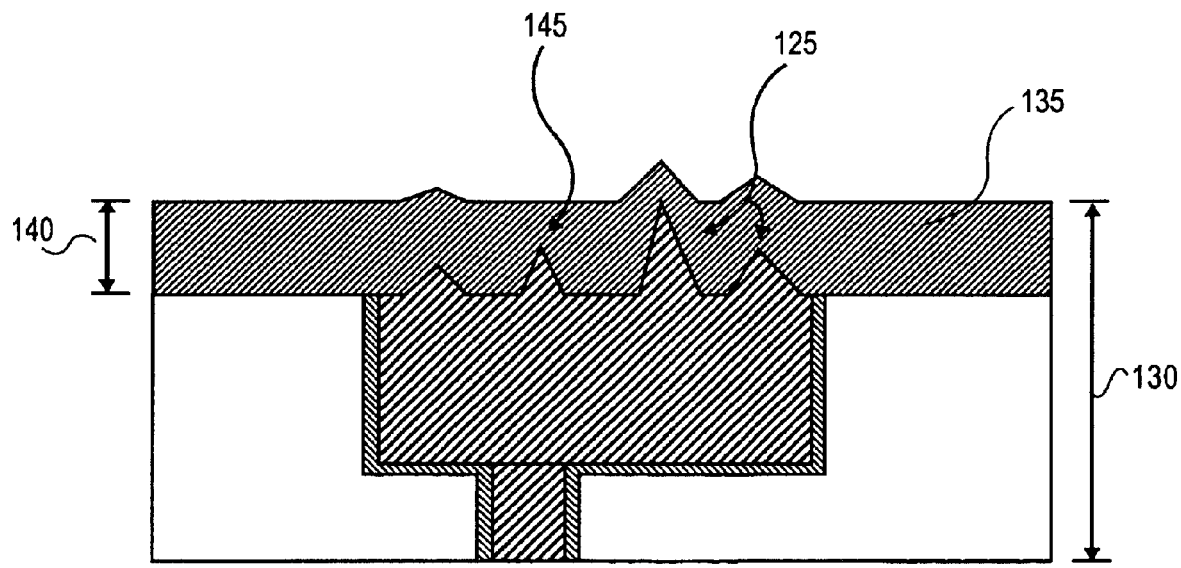
FIG. 1b is an illustration of a cross-sectional view of a dual damascene structure over which an etch stop layer has been formed that is conformal to the copper hillocks.
Figure 1C:
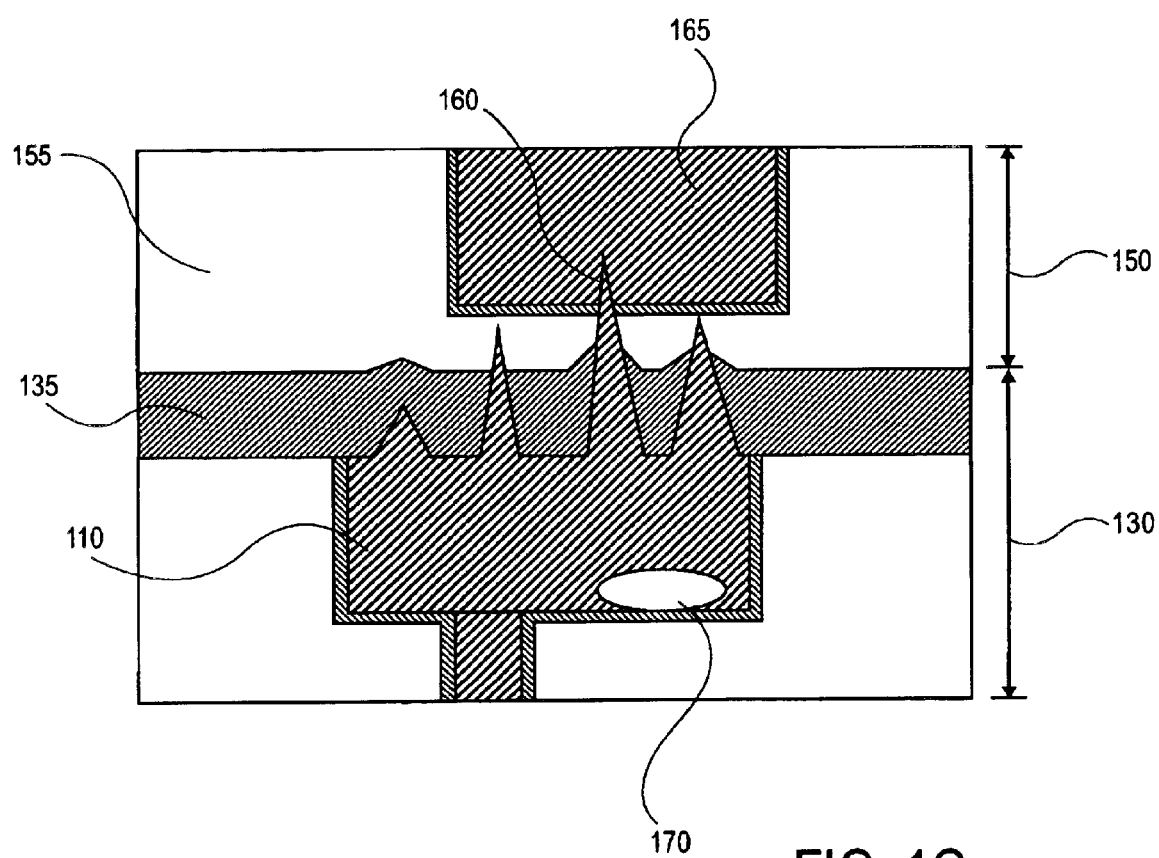
FIG. 1c is an illustration of a cross-sectional view of a copper interconnect structure that has been compromised by copper hillocks.
Figure 2:
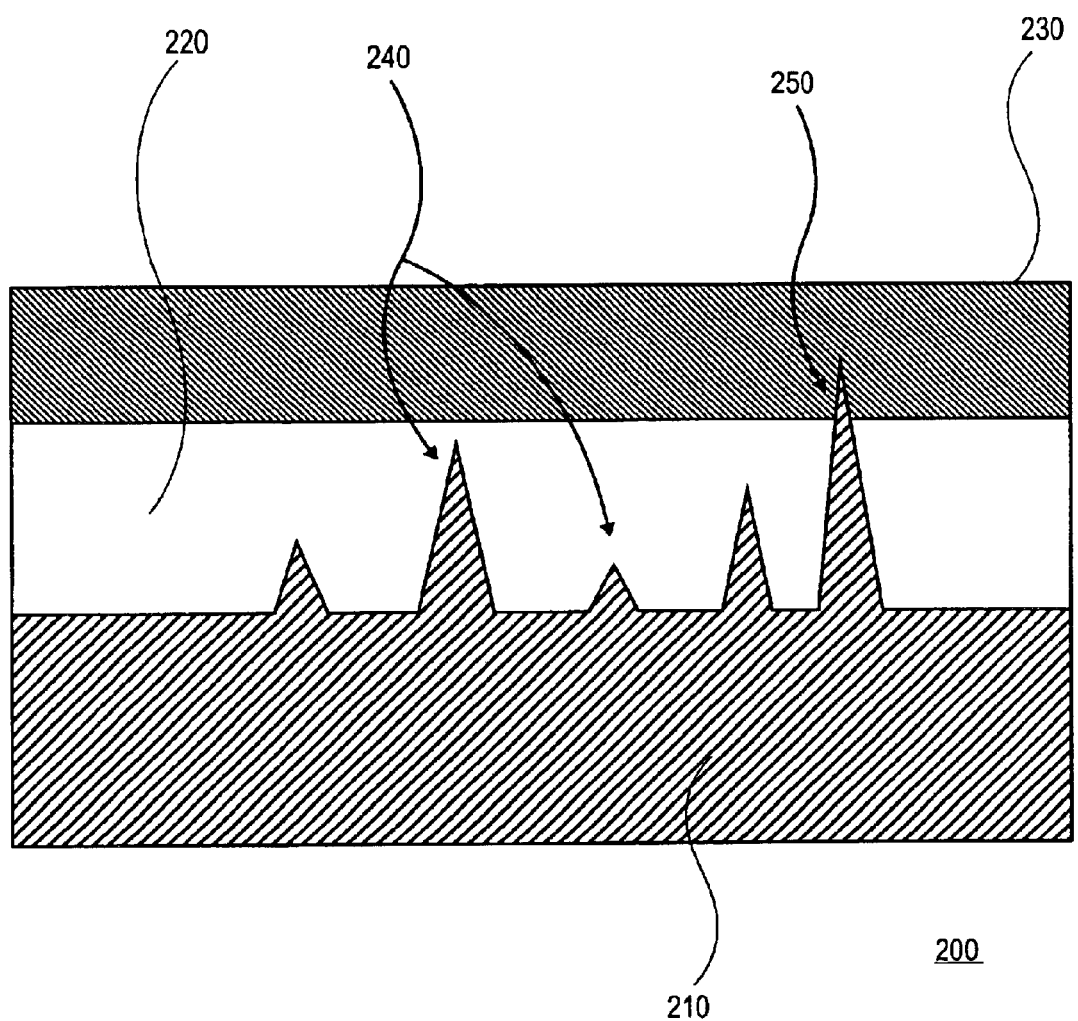
FIG. 2 is an illustration of a cross-sectional view of a MIM capacitor that has been compromised by copper hillocks.
Figure 3A:
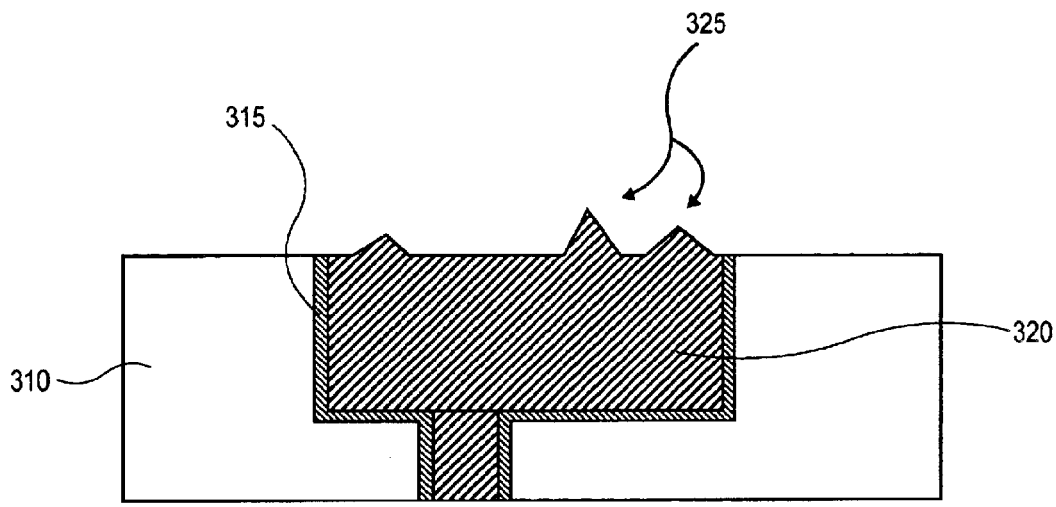
FIG. 3a is an illustration of a cross-sectional view of a dual damascene structure having copper hillocks.
Figure 3B:
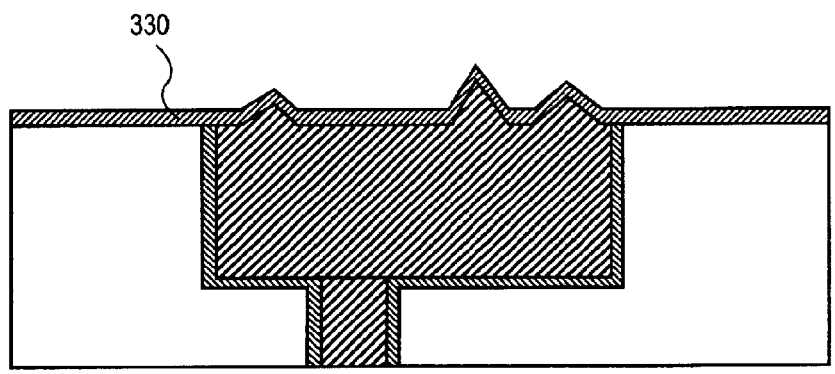
FIG. 3b is an illustration of a cross-sectional view of a dual damascene structure over which a thin dielectric layer has been formed using the ramped dielectric deposition technique to cap the copper hillocks.

In a preferred embodiment of the present invention the dielectric layer used to cap the copper hillocks is silicon nitride. This embodiment takes advantage of the deposition of a silicon nitride etch stop layer that is typically formed over the copper lines of a polished copper interconnect structure, as described above. In the alternative, the dielectric layer could be silicon carbide, a dielectric that can also serve as an etch stop and barrier to copper diffusion. This embodiment is illustrated in FIGS. 3a–d. FIG. 3a illustrates a copper interconnect structure formed by a dual damascene method after the surface of the structure has been polished. FIG. 3a has a first dielectric layer 310, into which a trench and via have been etched and over which a barrier layer 315 has been formed. Over the barrier, and within the trench and via, copper is deposited to form the first copper line 320. The first copper line 320 already has a few small hillocks 325 due to processing temperatures and pressures exerted thus far. Next, as illustrated in FIG. 3b, a thin silicon nitride layer 330 is deposited by PECVD (Plasma Enhanced Chemical Vapor Deposition) within 10 to 15 seconds while the temperature of the wafer is ramping towards the target deposition temperature of 400° C. The ramp rate of the temperature is not linear, but more similar to an exponential rate because the temperature change will be very rapid at first and then slow down as it approaches the target temperature. It is estimated that the deposition of the thin silicon nitride layer 330 is started at approximately 350° C. while the wafer is ramping towards the target temperature. This thin silicon nitride layer 330 will cap the copper line 320 before the target deposition temperature is reached and will suppress copper hillock growth during subsequent processing.

Figure 3C:
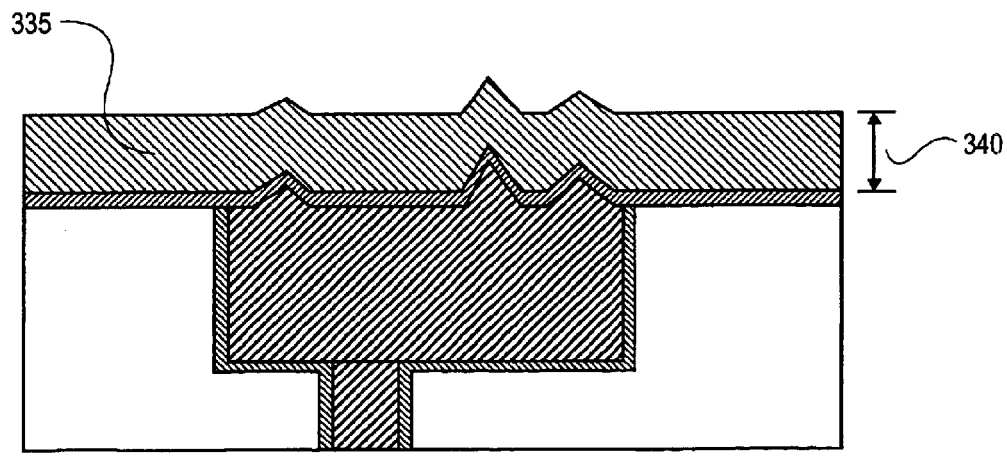
FIG. 3c is an illustration of a cross-sectional view of a dual damascene structure over which a dielectric etch stop layer has been formed.

The thin silicon nitride layer 330 will be somewhat inhomogeneous and less dense than a silicon nitride layer that is deposited at the target temperature of 400° C. or greater. The thin silicon nitride layer is typically 5–25% of the total silicon nitride layer. In a preferred embodiment, where the entire silicon nitride etch stop layer is 500 Å, it is estimated that the thickness of the thin silicon nitride film that is deposited before the copper layer begins to significantly expand is 125 Å. The thickness of the thin silicon nitride layer contributes to the suppression of the copper hillocks before the balance of the silicon nitride layer is deposited at the target temperature. Therefore, the thin silicon nitride layer can be formed to a thickness at which it will help suppress the formation of copper hillocks. Once the temperature of the wafer ramps up to 400° C., the balance of the silicon nitride etch stop layer 335 is deposited as illustrated in FIG. 3c. The silicon nitride layer 335 that is deposited at the target temperature comprises about 75–95% of the total silicon nitride layer and has a homogeneous and dense consistency. The thickness of the entire silicon nitride etch stop layer 340 is between 650 Å and 2000 Å. The thickness of the entire silicon nitride etch stop layer is also important because it will provide a greater resistance to the formation of copper hillocks to prevent their formation and also a sort of emergency buffer region through which the hillocks will have to grow before they can cause a short.

Figure 3D:
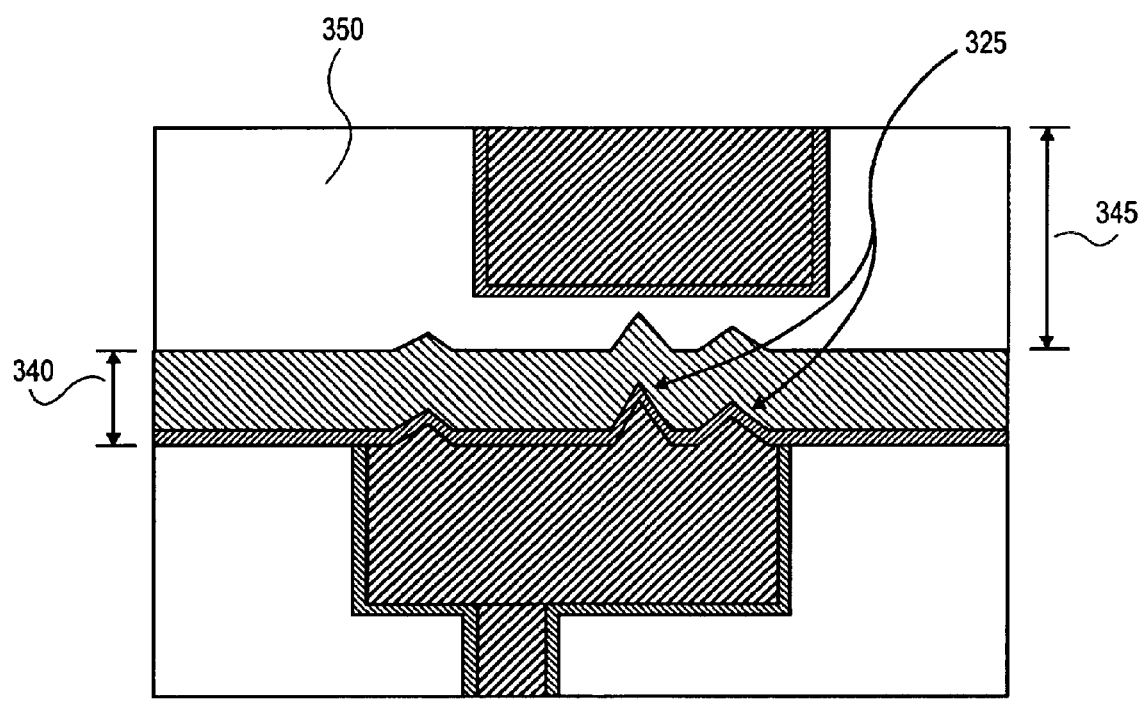
FIG. 3d is an illustration of a cross-sectional view of a copper interconnect structure in which copper hillocks have been capped and suppressed.

The thin silicon nitride layer 330 will suppress the growth of the copper hillocks 325 and the growth of new copper hillocks during the 400° C. deposition of the silicon nitride layer 335 and during subsequent processing of the interconnect structure. FIG. 3d illustrates the structure of 3c after a second interconnect structure 345 has been formed over the silicon nitride etch stop layer 340. The second interconnect structure 345 is formed by the conventional damascene or dual damascene technique. Significant copper hillock growth often occurs during the deposition of the dielectric layer 350 of the second interconnect structure 345. The dielectric layer 350 is typically carbon or fluorine doped silicon oxide deposited at temperatures of between 450° C. to 480° C. As illustrated in FIG. 3d, the silicon nitride layer 335 that is deposited using the ramped temperature dielectric deposition technique will suppress growth of the copper hillocks 325 during subsequent processing. The suppression of copper hillock growth will prevent shorts and voids.

Figure 4:
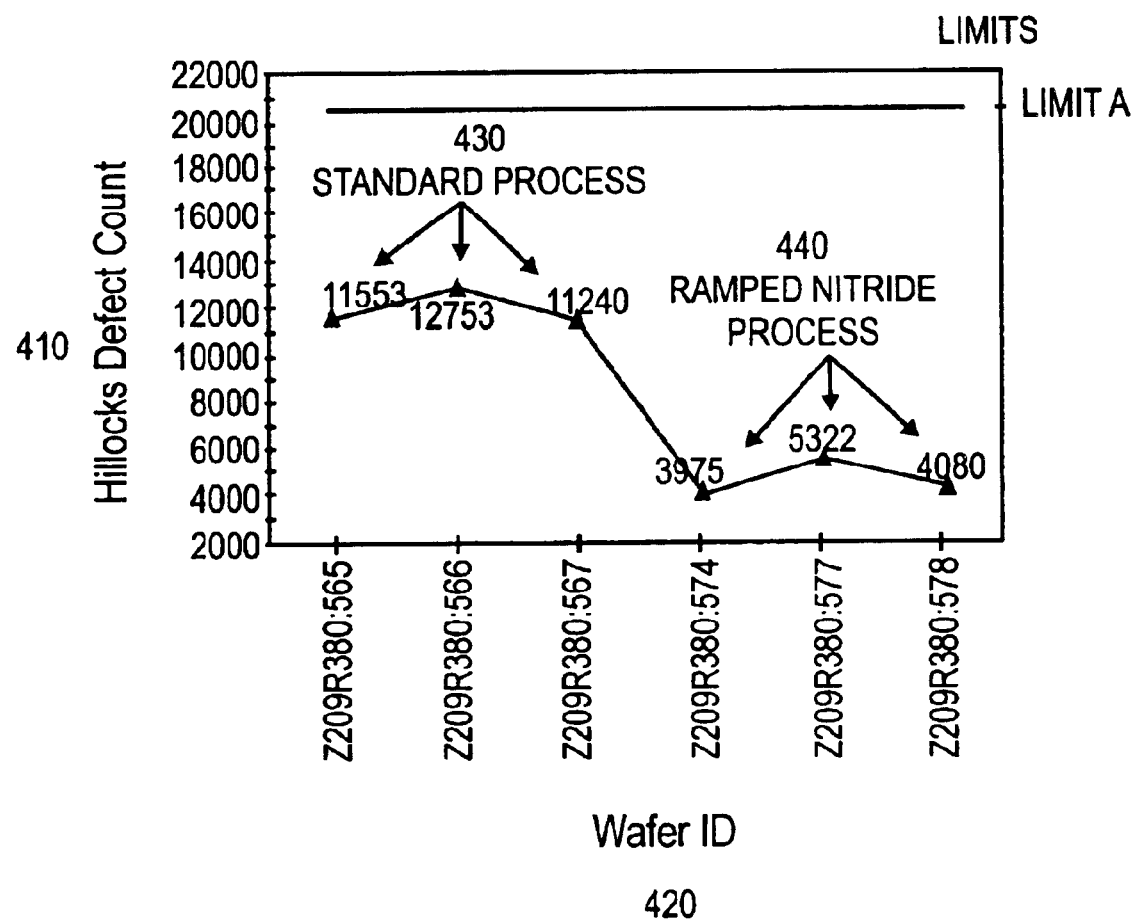
FIG. 4 is a graph showing the difference in hillocks defects between the standard dielectric deposition process and the ramped dielectric deposition process of the current invention.

FIG. 4 is a graph comparing the hillocks defect count of wafers having a silicon nitride layer deposited by the standard process to the hillocks defect count of wafers having a silicon nitride layer deposited by the ramped temperature dielectric deposition process. The hillocks defect count 410 is on the Y-axis and the wafer ID 420 is on the X-axis. The hillocks defect count for wafers having a silicon nitride layer deposited by the standard process is around 12000 (data points 430). The hillocks defect count for wafers having a silicon nitride layer deposited by the ramped temperature dielectric deposition technique is around 4000 (data points 440). As can be seen in the graph, the hillocks defect count is significantly higher for wafers having a silicon nitride layer deposited by the standard process 430 than it is for the ramped temperature process 440.

Figure 5:
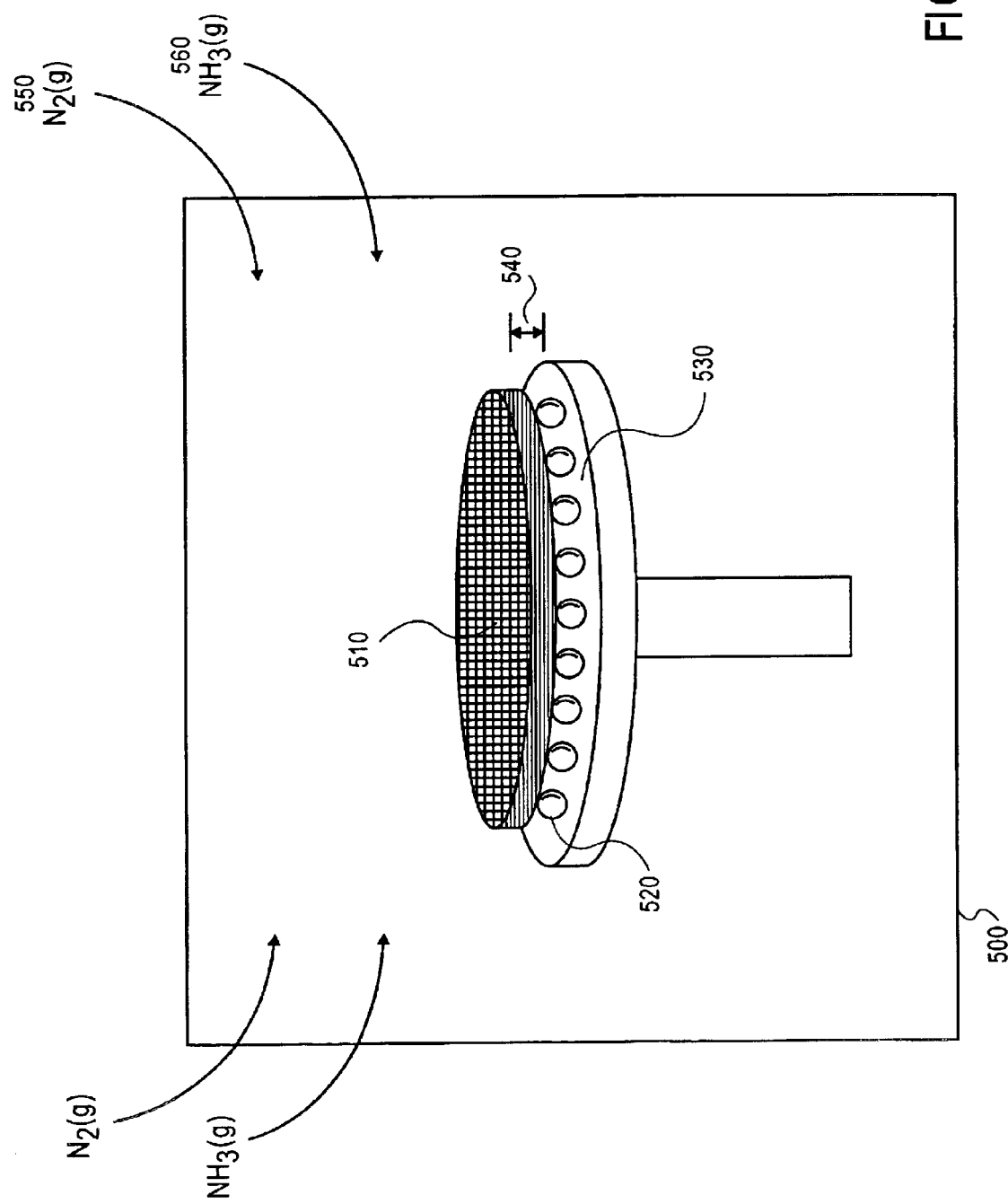
FIG. 5 is an illustration of the PECVD chamber in which the ramped dielectric deposition technique is performed.

It is difficult to precisely measure the temperature at which the deposition of the silicon nitride in the ramped dielectric deposition process begins. Therefore, the deposition is controlled by starting the deposition of the silicon nitride at a specific time after the ramping of the temperature of the wafer is begun. This time is dependent on the conditions used and the type of PECVD chamber used. The time at which the deposition is started is experimentally determined based on how effectively the silicon nitride film prevents copper hillock formation. In a preferred embodiment the PECVD chamber is the Vector™ model built by Novellus Systems, Inc. As illustrated in FIG. 5, a copper interconnect structure formed on a wafer 510 is placed into the Vector™ PECVD chamber 500 on sapphire balls 520 on top of a pedestal 530. The distance between the pedestal and the wafer 540 is approximately 0.005 inches. The pedestal 530 is heated to transfer heat to the wafer 510 through the sapphire balls 520 and ramp the temperature of the wafer from 20° C. to 400° C. for the deposition of silicon nitride. When the wafer is introduced into the chamber there is already nitrogen gas 550 and ammonia gas 560 flowing through the chamber. The nitrogen gas has a flow rate of between 2000 sccm and 4000 sccm (standard cubic centimeters). The ammonia gas has a flow rate of between 6000 sccm and 9000 sccm. The chamber also has a pressure of between 2.1 torr and 2.8 torr. The chemical precursors to the silicon nitride layer are silane, nitrogen, and ammonia. Under these conditions, and in this PECVD chamber, the deposition of silicon nitride begins at greater than 8 seconds and preferably 10 seconds after the wafer is placed on the sapphire balls on the pedestal. It is estimated that the deposition begins at a temperature of between 325° C. and 375° C.

Figure 6:
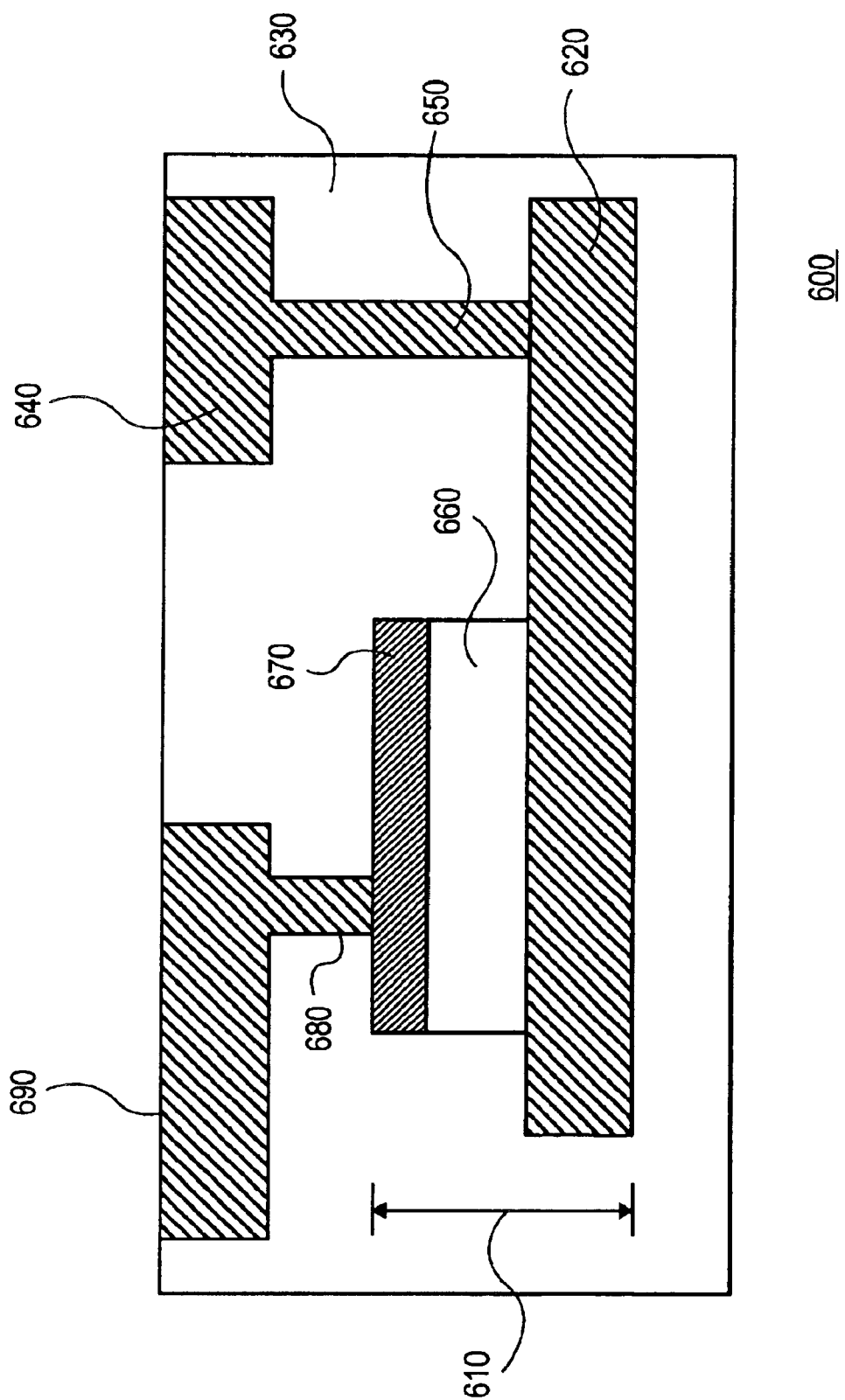
FIG. 6 is an illustration of a copper interconnect structure containing a MIM capacitor.

In an alternate embodiment, the ramped dielectric deposition technique is applied to the fabrication of metal-insulator-metal (MIM) capacitors. A MIM capacitor, such as 610 illustrated in FIG. 6, is typically part of a larger interconnect structure 600. The bottom electrode 620 of the MIM capacitor is a copper interconnect line formed in a trench in dielectric 630. This interconnect line that serves as the bottom electrode 620 can also be connected to other interconnect lines, such as 640, through a via 650. The MIM insulator 660 is a dielectric material such as silicon nitride (SiN.) The insulating layer in a MIM capacitor typically has a thickness of between 300 Å and 2000 Å. The top electrode 670 of the MIM capacitor is typically either tantalum or a tantalum based material like tantalum nitride (TaN.) The top electrode can be connected to another copper interconnect line, such as 690, through via 680.

Because the dielectric insulating layer in a MIM capacitor is thin, typically between 300 Å and 2000 Å (and preferably around 500 Å), there is a strong likelihood that a hillock will grow large enough to cause a short. Therefore, copper hillocks limit the scalability of the MIM capacitor because the insulating layer of the MIM must be at least thick enough to prevent shorts between the electrodes of the MIM capacitor. It would be valuable to make the insulating layer as thin as possible to maximize the capacitance of the MIM capacitor and scale down MIM capacitor devices. Embodiments of the current invention can suppress copper hillock growth to the point where the insulating layer of a MIM capacitor can potentially be thinner than 300 Å.

Copper hillocks also pose the significant problem of early breakdown of the MIM capacitor. A capacitor will break down when its breakdown voltage (also known as maximum voltage) is reached. When the breakdown voltage is exceeded, the dielectric inside the capacitor will breakdown and conduct. Copper hillocks can cause the early breakdown of a MIM capacitor because they lower the breakdown voltage. In particular, the sharp tips of the hillocks can have a high concentration of electricity that creates weak points in the capacitor, lowering the breakdown voltage. It is valuable to suppress the growth of copper hillocks because as they grow larger they become sharper. Smaller hillocks pose less of a problem because they tend to be blunt.

In an embodiment of the present invention, the ramped dielectric deposition processes described above for a dual damascene interconnect structure are applied to MIM capacitors to solve the problems caused by copper hillocks in MIM capacitors. The MIM capacitor 700 illustrated in FIG. 7 is fabricated using the ramped dielectric deposition process. The bottom copper electrode 710 is typically an interconnect line. The insulating layer 720 of the MIM capacitor is made up of two layers of the same dielectric material deposited at different temperatures. The dielectric material is typically SiN. Layer 730 is deposited at a temperature at which the copper will not significantly expand. For SiN this is below the target deposition temperature of 400° C. The deposition of layer 730 is started while the temperature of the wafer is being ramped up to the target deposition temperature for the insulating layer 720. Once the target deposition temperature is reached, the layer 740 is deposited. For SiN the layer 740 is deposited at 400° C. The layer 730 that was deposited at a temperature at which the copper will not significantly expand typically makes up only about twenty five percent of the total insulating layer 720. The same parameters as described above for the use of a Novellus Systems, Inc. Vector™ PECVD apparatus for the ramped temperature dielectric deposition technique also apply to this embodiment. In summary, the deposition of the SiN layer will begin at least 8 seconds after the wafer is placed into the deposition chamber under the conditions described above while the wafer is ramping towards the target deposition temperature of 400° C. A top electrode 750 is then formed over the insulating layer 720. Using this method, the copper hillocks 760 are capped and prevented from growing and forming during the silicon nitride deposition and during subsequent processing. The number of defects caused by copper hillocks in MIM capacitors and the early breakdown of MIM capacitors is greatly reduced by the ramped dielectric deposition process.

In an alternate embodiment, the copper hillocks of a MIM capacitor are suppressed by the doping of the copper bottom electrode with a dopant that will constrain the grain size of the copper. The presence of the dopants in the copper constrains the subsequent grain growth in the copper layer and has been demonstrated to provide a significant reduction of hillock defects on the surface of the copper. Dopants that will constrain the grain size of copper include carbon, metals such as aluminum, tin, and magnesium, and metalloids such as silicon.

Figure 8A:
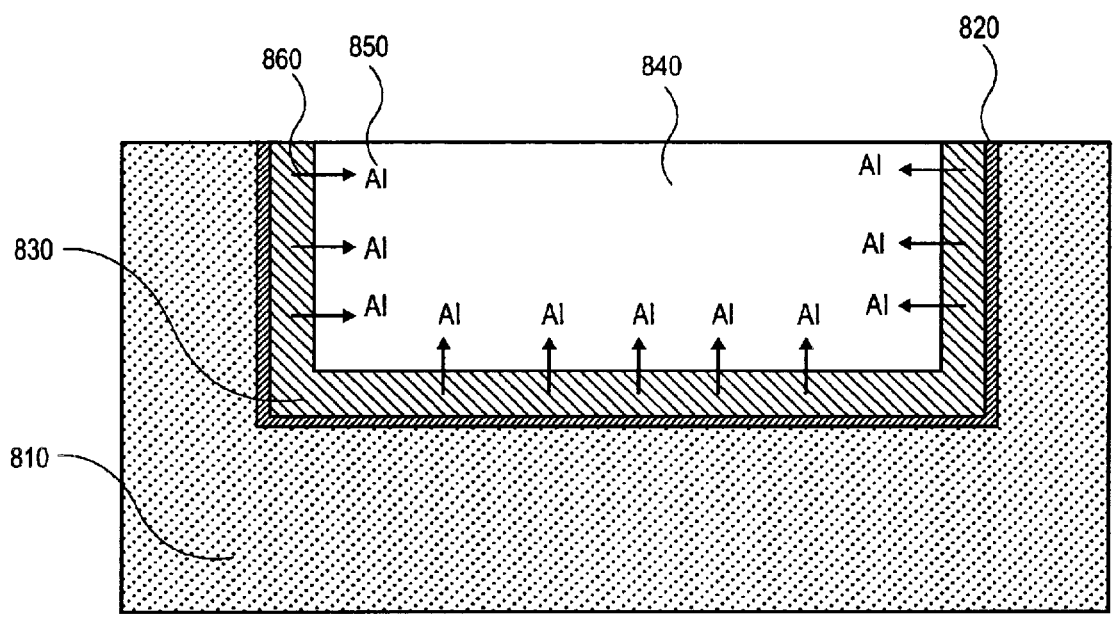
FIG. 8a is an illustration of a cross-section of a MIM capacitor bottom electrode that is doped with aluminum from a copper-aluminum alloy seed layer.

In an embodiment of the present invention the bottom electrode of a MIM capacitor is copper doped with aluminum by a copper-aluminum alloy as the seed layer. FIG. 8a illustrates this embodiment. A trench is etched into a dielectric layer 810 over which a barrier layer 820 is typically formed. Over the barrier layer 820 a seed layer 830 is deposited, typically by sputter deposition. The aluminum dopants are incorporated into the sputtered seed layer at a concentration of between 1% and 3%. The seed layer 830 is a copper-aluminum alloy that will provide the aluminum dopants for the bottom electrode of the MIM capacitor. This embodiment takes advantage of the seed layer that is already typically used in the fabrication of copper lines to provide the aluminum dopants for the copper layer. It is a simple matter to add the dopants to the deposition of the seed layer.

In an embodiment, a copper layer 840 is electroplated over the seed layer 830 to fill the trench and form the bottom electrode of the MIM. The aluminum dopants 850 are then diffused into the copper layer 840 as illustrated by the arrows 860. The aluminum dopants will diffuse on their own into the copper layer 840 or they can be diffused into the copper layer 840 by an anneal before the copper layer 840 is polished by chemical mechanical polishing (CMP). In a preferred embodiment, an anneal is performed to drive the aluminum dopants into the copper layer. During the anneal, the aluminum dopants diffuse fairly quickly into the copper layer. It is estimated that the concentration of aluminum in the copper layer 840 is 0.1% to 0.3%. Copper hillocks will be suppressed regardless of the amount of dopant in the copper, therefore, it is beneficial to use only a small amount of dopant in order to minimize the resistance of the bottom copper electrode.

Figure 8B:
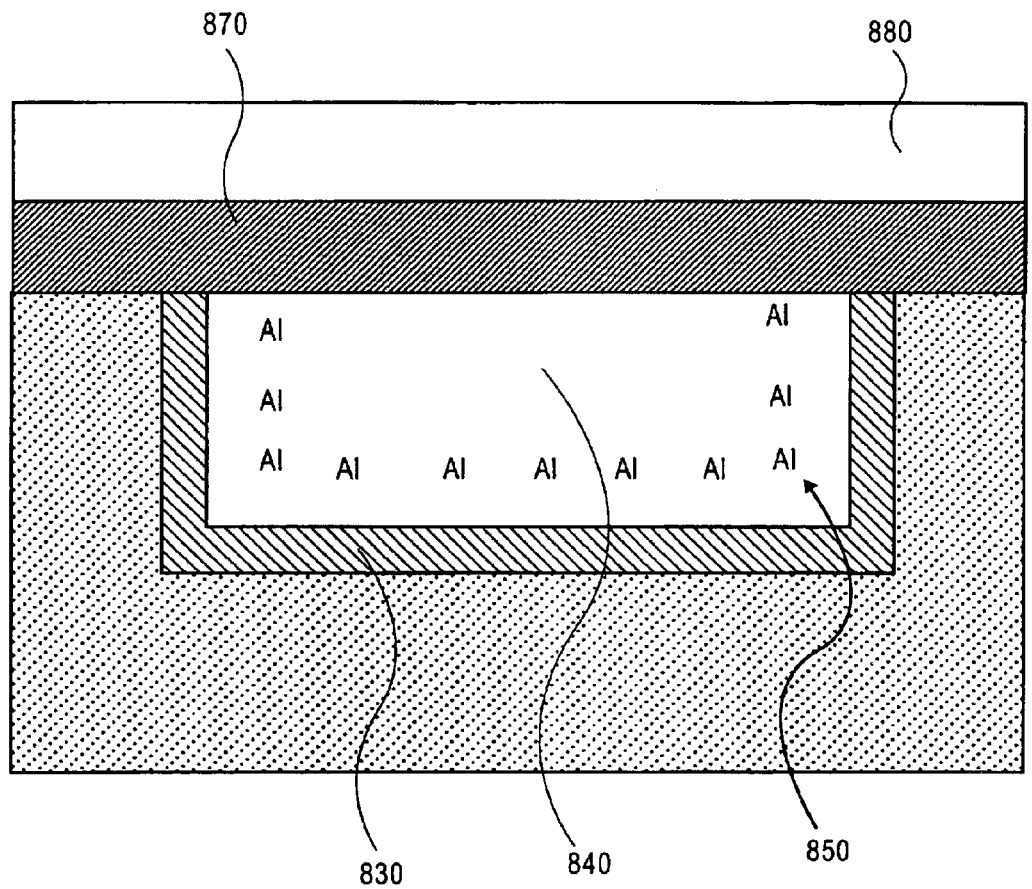
FIG. 8b is an illustration of a cross-section of a MIM capacitor that has an aluminum doped bottom electrode that has suppressed the formation of copper hillocks.

After performing an anneal to drive the aluminum into the copper layer 840, a second dielectric layer 870 is deposited over the copper layer 840 to serve as the MIM capacitor insulator, as illustrated in FIG. 8b. The second dielectric layer 870 is typically silicon nitride that is deposited by PECVD at 400° C. The second dielectric layer 840 is typically between 300 Å and 2000 Å, but could be even thinner due to the reduction in the height of the copper hillocks from the aluminum doping of the copper. In an alternate embodiment, the second dielectric layer of the MIM capacitor with the aluminum doped bottom electrode is deposited using the ramped nitride process described above. The ramped nitride process in combination with a bottom electrode comprising aluminum doped copper will further suppress the formation of copper hillocks to the point where the MIM capacitor insulator can potentially be thinner than 300 Å.

The top electrode 880 of the MIM capacitor is then deposited over the second dielectric layer 870. The top electrode can be any metal but is preferably tantalum or a tantalum based material such as tantalum nitride. This method of constructing a MIM capacitor is advantageous because it does not add any additional stages to the ordinary processing of a MIM capacitor. The doping of the copper described above could also be applied to an interconnect fabrication, such as the one described earlier using the ramped nitride process. Combining the doping of the copper with the ramped nitride process would further suppress the formation of copper hillocks.

Figure 9:
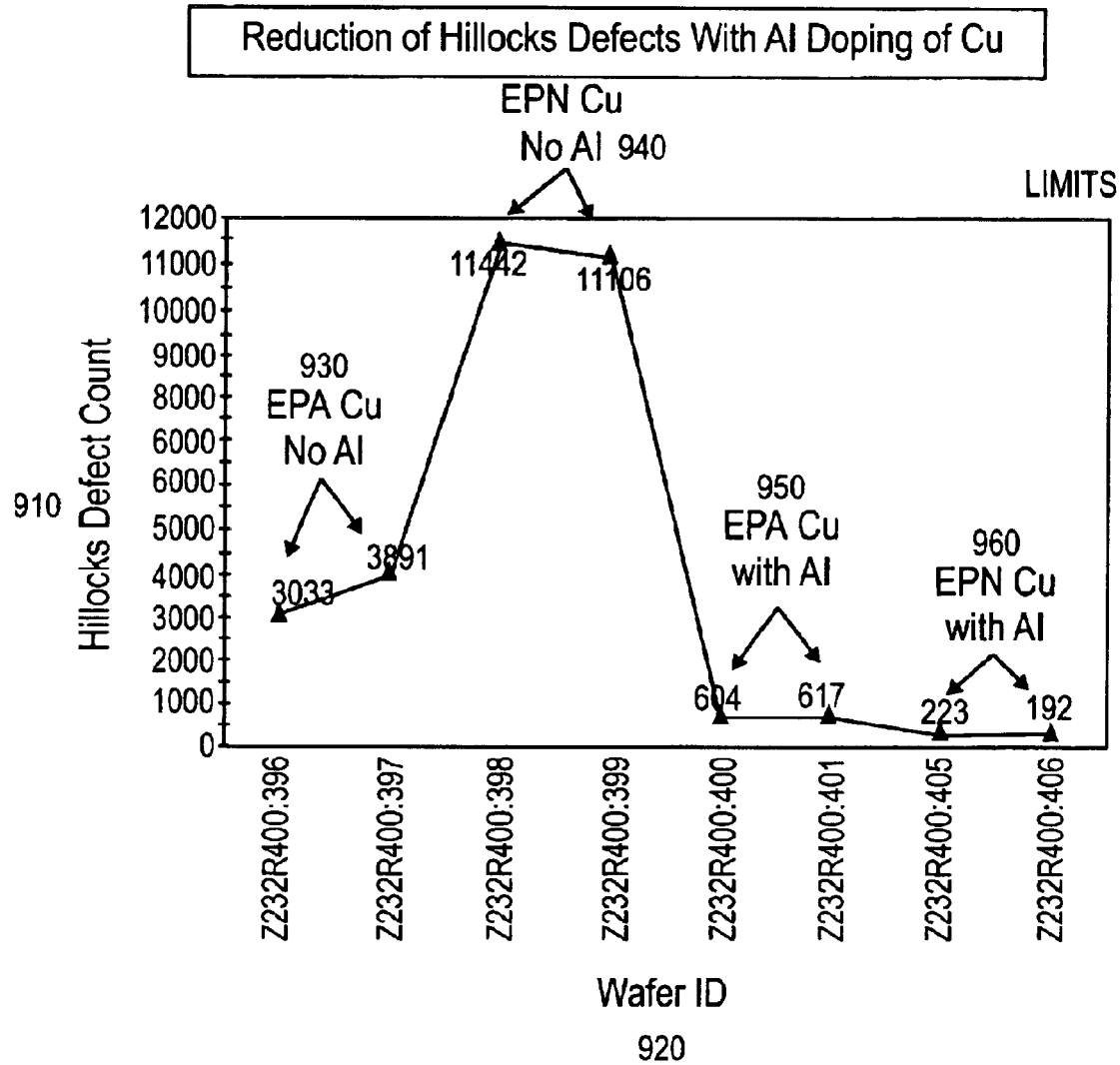
FIG. 9 is a graph showing the difference in hillocks defects between copper not doped with aluminum and copper doped with aluminum.

FIG. 9 is a graph illustrating the reduction of hillock defects on wafers where the copper bottom electrode of MIM capacitors have been doped with aluminum. The hillocks defect count 910 is on the Y-axis and the wafer ID's 920 are on the X-axis. This graph demonstrates that the copper hillocks defects are decreased considerably by doping a copper filled trench having a depth of 800 Å. Wafers with undoped copper have a very high number of hillocks defects, as demonstrated by the data points at 930 and 940. In contrast, data points 950 and 960 demonstrate dramatically reduced copper hillocks defect counts for copper trenches that have been doped with aluminum. The data points 930 and 950 were collected from wafers that had copper electroplating performed in an Applied Materials, Inc. electroplating tool (EPA) and the data points 940 and 960 were collected from wafers that had copper electroplating performed in a Novellus Systems, Inc. electroplating tool (EPN). As demonstrated by the data in FIG. 9, aluminum doping of a copper layer is very effective in reducing copper hillocks defects.

CONCLUSION

The embodiments of the present invention will suppress the formation of copper hillocks and thereby increase device yield and performance for both interconnect structures and MIM capacitors. Yield and performance is increased by the reduction in the number of shorts and voids in interconnect structures and MIM capacitors. Additionally, MIM capacitors are improved because they will not be prone to early breakdown due to copper hillocks and can be fabricated with a thinner insulating layer. The embodiments of the present invention also have the advantage of not adding any additional processing stages to the state of the art processing methods already employed. The ramped nitride process takes advantage of the ramping of the temperature of the wafer that already occurs within a PECVD chamber and the doping process takes advantage of the deposition of a seed layer for copper.

Other modifications from the specifically described devices, solutions, and processes will be apparent to those skilled in the art and having the benefit of this disclosure. Accordingly, it is intended that all such modifications and alterations be considered as within the spirit and scope of the invention as defined by the subjoined claims.

What is claimed is:

1. A method comprising:
   providing a metal layer formed on a wafer, wherein the wafer has a first temperature;
   ramping the first temperature of the wafer towards a second temperature;
   beginning a deposition of a dielectric layer directly onto the metal layer after the ramping of the first temperature of the wafer is commenced but before the second temperature is reached; and,
   ending the deposition of the dielectric layer once a predetermined thickness is formed.

2. The method of claim 1 wherein the dielectric layer comprises silicon nitride.

3. The method of claim 2 wherein the deposition of the silicon nitride is begun 10 seconds or less after the ramping of the first temperature is commenced.

4. The method of claim 2 wherein the first temperature is less than 400° C.

5. The method of claim 2 wherein the second temperature is at least 400° C.

6. The method of claim 2 wherein the thickness of the dielectric layer is less than 2000 Å.

7. A method of forming an interconnect structure comprising:
   providing a first copper interconnect formed on a wafer, wherein the wafer has a first temperature;
   ramping the first temperature of the wafer towards a second temperature;
   beginning a deposition of a silicon nitride layer over the first copper interconnect less than or equal to 10 seconds after the ramping of the first temperature of the wafer is commenced;
   ending the deposition of the silicon nitride layer once the silicon nitride layer has a thickness of between 650 Å and 2000 Å; and,
   forming a second copper interconnect over the silicon nitride layer.

8. The method of claim 7 wherein the first copper interconnect and the second copper interconnect are formed by dual damascene processes.

9. The method of claim 7 wherein the silicon nitride layer is deposited by PECVD.

10. A method of forming a metal-insulator-metal capacitor comprising:
    providing a copper bottom electrode formed on a wafer, wherein the wafer has a first temperature;
    ramping the first temperature of the wafer towards a second temperature;
    beginning a deposition of a silicon nitride layer directly onto a first copper layer less than or equal to 10 seconds after the ramping of the first temperature of the wafer is commenced;
    ending the deposition of the silicon nitride layer once the silicon nitride layer has a thickness of less than 2000 Å; and,
    forming a tantalum based top electrode over the silicon nitride layer.

11. The method of claim 10 wherein the copper bottom electrode contains a dopant that will constrain the grain size of the first copper layer.

12. The method of claim 11 wherein the dopant is aluminum.

13. The method of claim 10 wherein the wafer is heated by placing the wafer on a heated pedestal within a PECVD chamber.

14. The method of claim 13 wherein the pedestal has a temperature of 400° C.

15. The method of claim 13 wherein the wafer is placed on sapphire balls that are on top of the pedestal.

16. The method of claim 13 wherein the distance between the pedestal and the wafer is around 0.005 inches.

17. The method of claim 13 wherein the chamber has a pressure of between 2.1 and 2.8 Torr.

18. The method of claim 13 wherein the chamber has nitrogen gas and ammonia gas flowing through it.

19. The method of claim 18 wherein the nitrogen gas has a flow rate of between 2000 sccm and 4000 sccm.

20. The method of claim 18 wherein the ammonia gas has a flow rate of between 6000 sccm and 9000 sccm.

21. A method comprising:
    providing a copper layer with a first temperature at which the copper will not expand;
    ramping the first temperature to a second temperature at which the copper layer will expand; and,
    capping the copper layer during the ramping of the first temperature to the second temperature with a material that will suppress the growth of copper hillocks, the material formed directly on the copper layer.

22. The method of claim 21 wherein the first temperature is less than 150° C.

23. The method of claim 21 wherein the second temperature is at least 150° C.

* * * * *